(12) United States Patent
Hong et al.

(10) Patent No.: US 9,142,566 B2
(45) Date of Patent: Sep. 22, 2015

(54) METHOD OF FORMING DIFFERENT VOLTAGE DEVICES WITH HIGH-K METAL GATE

(71) Applicant: Freescale Semiconductor, Inc., Austin, TX (US)

(72) Inventors: Cheong Min Hong, Austin, TX (US); Asanga H. Perera, West Lake Hills, TX (US); Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 36 days.

(21) Appl. No.: 14/021,485

(22) Filed: Sep. 9, 2013

(65) Prior Publication Data

US 2015/0069524 A1    Mar. 12, 2015

(51) Int. Cl.

| | |
|---|---|
| *H01L 29/51* | (2006.01) |
| *H01L 27/12* | (2006.01) |
| *H01L 21/28* | (2006.01) |
| *H01L 29/66* | (2006.01) |
| *H01L 29/10* | (2006.01) |
| *H01L 21/8238* | (2006.01) |
| *H01L 29/165* | (2006.01) |

(52) U.S. Cl.
CPC ...... *H01L 27/1203* (2013.01); *H01L 21/28194* (2013.01); *H01L 21/82385* (2013.01); *H01L 21/823842* (2013.01); *H01L 21/823857* (2013.01); *H01L 29/1054* (2013.01); *H01L 29/513* (2013.01); *H01L 29/517* (2013.01); *H01L 29/6659* (2013.01); *H01L 29/165* (2013.01)

(58) Field of Classification Search
CPC ... H01L 29/511; H01L 27/1203; H01L 21/84; H01L 21/28158; H01L 29/513; H01L 29/517; H01L 29/6659; H01L 29/1054; H01L 29/165
USPC .......... 438/587, 217, 276, 289, 291; 257/392, 257/391
See application file for complete search history.

(56) References Cited

U.S. PATENT DOCUMENTS

| | | | |
|---|---|---|---|
| 8,460,996 B2 | 6/2013 | Karve et al. | |
| 2007/0023817 A1 | 2/2007 | Dao | |
| 2011/0136306 A1* | 6/2011 | Ariyoshi et al. | ............. 438/227 |

OTHER PUBLICATIONS

S. Krishnan et al., A Manufacturable Dual Channel (Si and SiGe) High-K Metal Gate CMOS Technology with Multiple Oxides for High Performance and Low Power Applications, 2011 IEEE International Electron Devices Meeting (IEDM), Dec. 5-7, 2011.

*Primary Examiner* — Thinh T Nguyen
(74) *Attorney, Agent, or Firm* — Terrile, Cannatti, Chambers & Holland, LLP; Michael Rocco Cannatti

(57) ABSTRACT

A method and apparatus are described for integrating high voltage (HV) transistor devices and medium voltage or dual gate oxide (DGO) transistor devices with low voltage (LV) core transistor devices on a single substrate, where each high voltage transistor device (160) includes a metal gate (124), an upper high-k gate dielectric layer (120), a middle gate dielectric layer (114) formed with a relatively lower high-k dual gate oxide layer, and a lower high voltage gate dielectric stack (108, 110) formed with one or more low-k gate oxide layers (22), where each DGO transistor device (161) includes a metal gate (124), an upper high-k gate dielectric layer (120), and a middle gate dielectric layer (114) formed with a relatively lower high-k dual gate oxide layer, and where each core transistor device (162) includes a metal gate (124), an upper high-k gate dielectric layer (120), and a base oxide layer (118) formed with one or more low-k gate oxide layers.

8 Claims, 4 Drawing Sheets

METHOD OF FORMING DIFFERENT VOLTAGE DEVICES WITH HIGH-K METAL GATE

BACKGROUND OF THE INVENTION

1. Field of the Invention

The present invention is directed in general to the field of semiconductor devices and methods for manufacturing same. In one aspect, the present invention relates to the fabrication of high-k metal gate devices for different voltage level transistors integrated on a single substrate or chip.

2. Description of the Related Art

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. However, the integration of non-volatile memory with CMOS transistors on a single chip can create a number of integration difficulties and challenges as the different materials and/or fabrication processes conflict with one another when the semiconductor fabrication processes used to form high voltage (HV) transistors (which handle high voltages (e.g., 12V or higher) that are suitable for programming non-volatile memory cells) or dual-gate oxide (DGO) devices (which are higher voltage, low-leakage devices suitable for battery-powered devices) are not compatible with the processes used to fabricate low voltage (LV) transistors (which are used for low-voltage logic circuits, such as microcontrollers, SRAMs, ROMs). These challenges and difficulties can be exacerbated as device scaling increases and new device structures, such as metal gate electrodes, are replacing conventional polysilicon gate electrodes used with CMOS technology. For example, the integration of medium voltage and high voltage devices into a high-k metal gate (HKMG) process flow can result in the formation of shallow trench isolation (STI) divots in the low voltage device areas that are masked off during gate dielectric formation. The integration of different HKMG device process flows can also result in other challenges, such as formation of high voltage NMOS and PMOS transistor devices with gate dielectric layers having different thicknesses when oxide growth is employed to form the gate dielectric layers. These challenges, among others, complicate the process of fabricating CMOS devices with embedded non-volatile memory, increasing the manufacturing costs and the difficulty of achieving high performance levels.

BRIEF DESCRIPTION OF THE DRAWINGS

The present invention may be understood, and its numerous objects, features and advantages obtained, when the following detailed description is considered in conjunction with the following drawings, in which.

Figure 1:
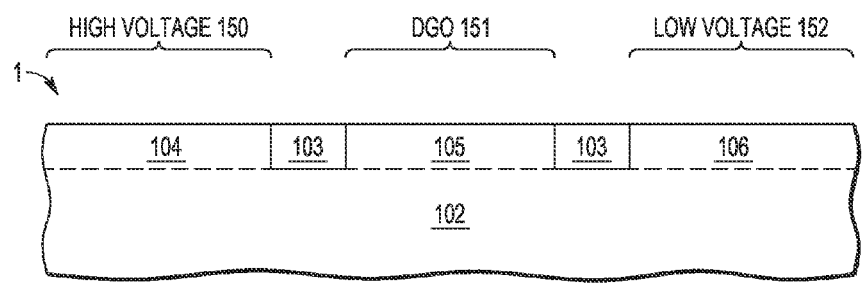
FIGS. 1-11 show a semiconductor device during successive phases of a fabrication sequence in which medium and high voltage transistor devices are integrated with a gate-first process used to form low voltage NMOS and PMOS high-k metal gate transistor devices.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for integrating high voltage (HV) transistor devices and medium voltage dual gate oxide (DGO) transistor devices with low voltage (LV) core transistor devices on a single substrate where each transistor includes a metal gate and one or more high-k gate dielectric layers that meet performance and reliability requirements of medium and high voltage operations while minimizing the impacts on low voltage devices. As disclosed, a high voltage gate dielectric layer is selectively formed in the high voltage and low voltage device areas of the wafer substrate to include a first thermally grown dielectric layer (e.g., thermal oxide) and a second deposited dielectric layer (e.g., deposited oxide) which are formed to a predetermined thickness to cover the high voltage and low voltage device areas, but not the medium voltage device area of the wafer substrate. With the medium voltage device area of the wafer substrate exposed, an additional dielectric layer (e.g., low pressure chemical vapor deposition high temperature oxide) having a predetermined thickness is deposited to cover the low, medium, and high voltage device areas. After clearing the gate dielectric layers from the low voltage device area, a high-k gate stack is formed over the wafer substrate (including the low, medium, and high voltage device areas), patterned, and etched to form patterned gate electrodes in the low, medium, and high voltage device areas. In selected embodiments, the high-k gate stack may be formed by growing a base oxide having a first predetermined thickness on at least the cleared low voltage device area, followed by depositing a high-k gate dielectric layer having a second predetermined thickness over the wafer substrate along with an appropriate barrier metal layer and/or metal interface layer to cover the low, medium, and high voltage device areas. The high-k gate stack is completed by forming a conductive gate electrode layer, such as doped polysilicon, over the wafer substrate to a predetermined thickness, and then selectively etched to form patterned gate electrodes in the low, medium, and high voltage device areas. As a result, the patterned gate electrodes in the high voltage device areas include a high voltage gate dielectric layer formed with the first thermally grown dielectric layer, second deposited dielectric layer, additional dielectric layer, base oxide layer, and high-k gate dielectric layer. In addition, the patterned gate electrodes in the medium voltage device areas include a medium voltage gate dielectric layer that is thinner than the high voltage gate dielectric layer, and that is formed with the additional dielectric layer, base oxide layer, and high-k gate dielectric layer. Finally, the patterned gate electrodes in the low voltage device areas include an ultrathin low voltage gate dielectric layer that is thinner than the medium voltage gate dielectric layer, and that is formed with the base oxide layer and high-k gate dielectric layer. In selected embodiments, the wafer substrate may be formed to include a channel layer in the PMOS and/or NMOS devices areas of one or both of the medium or low voltage device areas, where the channel layer is formed from a semiconductor material having a different electrical property than the underlying semiconductor substrate (e.g., a SiC channel layer in the NMOS device area or a SiGe channel layer in the PMOS device area). When the PMOS devices are formed on a SiGe channel layer, the threshold voltage of PMOS metal-gate devices can be adjusted independently of NMOS devices. The medium voltage transistor devices may be fabricated to include a first, relatively lower high-k layer (e.g., Hafnium silicate or $HfSiO_xN_y$) and a second, relatively higher high-k metal oxide layer (e.g., Hafnium oxide), while the core transistor devices may be fabricated using the second, relatively higher high-k metal oxide layer as the core gate dielectric layer. Finally, a single metal layer and polysilicon layer may be sequentially formed or deposited over the low, medium, and high voltage device areas, and then selectively etched to form PMOS and NMOS gate electrodes having tuned the threshold voltages and improved gate oxide integrity.

In this disclosure, an improved system, apparatus, and fabrication method are described for fabricating embedded non-volatile memory devices on-chip with CMOS metal-gate transistors that address various problems in the art where various limitations and disadvantages of conventional solutions and technologies will become apparent to one of skill in the art after reviewing the remainder of the present application with reference to the drawings and detailed description provided herein. For example, there are challenges with combining non-volatile memory (such as flash EEPROM) into a standard CMOS process flow, especially as CMOS technology is increasingly replacing silicon dioxide gate dielectrics and polysilicon gate conductors with high dielectric constant (high-k) dielectrics in combination with metal gate electrodes formed with one or more metal layers to form high-k metal gate (HKMG) electrode stacks. There are also challenges with integrating low, medium, and high voltage transistor devices into a single chip to meet performance and reliability requirements of medium and high voltage operations while minimizing the impacts on low voltage devices. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. In addition, it is noted that, throughout this detailed description, certain layers of materials will be deposited and removed to form the depicted semiconductor structures. Where the specific procedures for depositing or removing such layers are not detailed below, conventional techniques to one skilled in the art for depositing, removing or otherwise forming such layers at appropriate thicknesses shall be intended. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Such descriptions and representations are well known and not considered necessary to teach one skilled in the art of how to make or use the present invention.

Referring now to FIG. 1, there is shown a partial cross-sectional view of a semiconductor wafer structure 1 having a substrate 102 which includes a high voltage device area 150, a medium voltage or dual gate oxide (DGO) device area 151, and a low voltage device area 152. Though the various structures, well, and layer regions illustrated herein are shown in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted device structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++). As described below, flash high voltage transistors and/or flash memory cells (e.g., split-gate thin film storage non-volatile memory bitcells) may be formed in the high voltage area 150, while dual voltage or dual gate oxide transistors are formed in the DGO area 151 and low voltage CMOS core transistors are formed in the low voltage area 152 with high-k dielectric metal gate (HKMG) electrodes.

In the semiconductor structure 1, the depicted substrate 102 may be formed as a bulk semiconductor substrate or other substrate in which one or more additional semiconductor layers and/or well regions are formed using epitaxial semiconductor growth and/or selective doping techniques as described more fully hereinbelow. For example, the substrate 102 may be a semiconductor-on-insulator (SOI) type substrate which includes a semiconductor substrate, buried insulator layer formed over the substrate, and p-type semiconductor substrate layer formed over the buried insulator or oxide layer (not shown). Alternatively and depending on the type of transistor being fabricated, the semiconductor substrate 102 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof.

In an upper portion of the substrate 102, a plurality of shallow trench isolation (STI) structures 103 are formed that divide the substrate 102 into separate regions, such as a high voltage area 150, DGO area 151, and low voltage area 152. Thus, the STI structures 103 define lateral boundaries of different regions 150-152, and may be formed using any desired technique, such as selectively etching an opening in the substrate 102 using a patterned mask or photoresist layer (not shown), depositing a dielectric layer (e.g., oxide) to fill the opening, and then polishing the deposited dielectric layer until planarized with the remaining substrate 102. Any remaining unetched portions of the patterned mask or photoresist layer(s) are stripped. As will be appreciated, the STI structures 103 may be formed in other ways in other embodiments.

In the defined regions 150-152, one or more of the upper portions 104-106 of substrate 102 may include active substrate layers between the STI regions 103 that may be formed with a different semiconductor material from the substrate 102 and/or doped differently, depending on whether the transistors formed in each area are n-type or p-type devices. For example, the active substrate layers in any region 150-152 used to form NMOS transistors may be implanted with impurities of a first conductivity type (e.g., p-type impurities, such as boron) to form a p-well region, where the masking, implantation energy, dosage, and profile for the p-well region are suitable for the formation of NMOS transistors. In addition, the active substrate layers in any region 150-152 used to form PMOS transistors may be implanted with impurities of a second type (e.g., n-type impurities, such as arsenic or phosphorus) to form an n-well region, where the masking, implantation energy, dosage, and profile for the n-well region are suitable for the formation of PMOS transistors. Thus, it will be appreciated that the polarity of the well regions formed in each region 150-152 will depend on the type of device (PMOS or NMOS) being formed.

In addition or in the alternative, the active substrate layers in the DGO region 151 and any portion of the low voltage region 152 used to form PMOS transistors may include a silicon germanium-based channel layer 105, 106 (e.g., SiGe, SiGeC) that is selectively formed from the underlying silicon substrate layer 102. In selected embodiments, the silicon germanium-based channel layers 105, 106 may be selectively formed by forming a patterned masking layer (not shown) over the semiconductor wafer structure 1 (e.g., with patterned oxide layer and/or nitride layer) to protect the high voltage region 150 and any portion of the low voltage region 152 used to form NMOS transistors, and then epitaxially growing the silicon germanium layers 105, 106 over the unmasked regions of the semiconductor wafer structure 1 to form a thin, compressively stressed SiGe or SiGeC layer over the DGO area 151 and PMOS areas of the low voltage area 152 that will be used to form the PMOS devices. The epitaxial growth may be achieved by a process of chemical vapor deposition (CVD) at a chamber temperature between 400 and 900° C. in the presence of dichlorosilane, germane ($GeH_4$), HCl, and hydrogen gas. Compressive stress and lower band gap of SiGe allows for threshold voltage lowering and mobility enhancement for PMOS devices in regions 152. In addition, SiGe can be doped with boron for further reduction of PMOS threshold voltage. In other embodiments, any portion of the low voltage region 152 used to form NMOS transistors may include a silicon carbide-based layer 106 or other semiconductor material that changes a band gap of a channel region for NMOS devices. Though shown as being formed within the active substrate layers 105, 106, it will be appreciated that the epitaxially grown channel layers may be formed or grown as a separate layer on top of the active substrate layers 105, 106.

Figure 2:
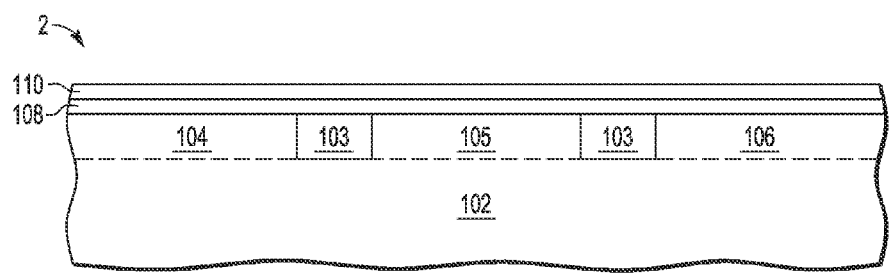

FIG. 2 illustrates processing of a semiconductor wafer structure 2 subsequent to FIG. 1 after one or more high voltage gate dielectric layers 108, 110 are disposed over the semiconductor wafer structure 2. Prior to forming the high voltage gate dielectric layers 108, 110, a pre-cleaning process (e.g., an RCA standard clean 1 or 2 solution without HF) may be applied to clear the top surfaces of the relevant regions. On the exposed portions of the substrate 102, a first dielectric layer 108 is formed by thermally oxidizing or growing an oxide layer 108 to a predetermined thickness in the range of 1-100 Angstroms (e.g., 25-75 Angstroms, or more particularly, 50 Angstroms) on top of the low, medium, and high voltage device areas 150-152, though other thicknesses and/or materials may be used. On the first dielectric layer 108, a second dielectric layer 110 is formed, such as by depositing an oxide layer using chemical vapor deposition (CVD), plasma-enhanced chemical vapor deposition (PECVD), physical vapor deposition (PVD), atomic layer deposition (ALD), or any combination(s) of the above. In selected embodiments, the second dielectric layer 110 may be formed by a low temperature CVD or ALD process to a predetermined final thickness in the range of 1-100 Angstroms (e.g., 25-75 Angstroms, or more particularly, 50 Angstroms), though other thicknesses and/or materials may be used. A suitable gate dielectric material for the first dielectric layer 108 is an insulator material having a dielectric constant value that is lower than the dielectric constant value of the second gate dielectric layer 110. A suitable temperature for forming the second dielectric layer 110 is in the range of approximately 200 degrees Celsius to approximately 400 degrees Celsius, and is controlled to reduce or eliminate the diffusion of germanium from any underlying silicon germanium channel layer.

Figure 3:
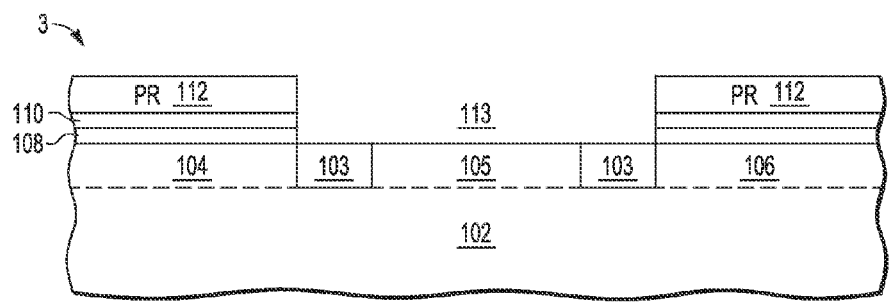

FIG. 3 illustrates processing of a semiconductor wafer structure 3 subsequent to FIG. 2 after removing the one or more high voltage gate dielectric layers 108, 110 from the medium voltage or DGO device areas 151. While the high voltage gate dielectric layers 108, 110 may be removed with any desired sequence, one or more selective etch processes may be used in selected embodiments by first forming a patterned etch mask 112 on the high voltage gate dielectric layers 108, 110 in the high voltage and low voltage device areas 150, 152. The patterned etch mask 112 may be formed by applying a layer of photoresist that is patterned directly on the second dielectric layer 110 to mask the HV and LV device areas 150, 152, or a multi-layer masking technique may be used to form a etch mask pattern 112 over the second dielectric layer 110 in the HV and LV device areas 150, 152. With the patterned etch mask 112 in place, exposed portions of the high voltage gate dielectric layers 108, 110 are removed, thereby forming an opening 113 which exposes the DGO device areas 151 of the substrate 102. The pattern transfer and etching of the mask layer 112 may use one or more etching steps to remove the unprotected portions of the layers 108, 110, including a dry etching process such as reactive-ion etching, ion beam etching, plasma etching or laser etching, a wet etching process wherein a chemical etchant is employed or any combination thereof. For example, the exposed portions of high voltage gate dielectric layers 108, 110 may be anisotropically etched using a reactive ion etch process, leaving the high voltage gate dielectric layers 108, 110 in the HV and LV device areas 150, 152. In other embodiments, the exposed portions of the high voltage gate dielectric layers 108, 110 may be removed using a hydrofluoric acid (HF) clean, such as a diluted HF clean process. As a result, the high voltage and low voltage device areas 150, 152 of the wafer substrate are formed with a first thermally grown dielectric layer 108 (e.g., thermal oxide) and a second deposited dielectric layer 110 (e.g., deposited oxide) which are formed to a predetermined thickness to cover the high voltage and low voltage device areas 150, 152, but not the medium voltage device area 151 of the wafer substrate.

Figure 4:
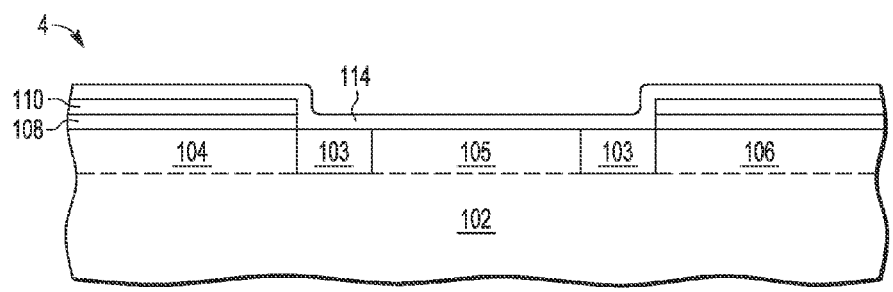

FIG. 4 illustrates processing of a semiconductor wafer structure 4 subsequent to FIG. 3 after the mask layer 112 is removed, and one or more dual gate oxide layers 114 are disposed over the semiconductor wafer structure 4. In selected embodiments, the dual gate oxide layer(s) 114 may be deposited on top of the low, medium, and high voltage device areas 150-152 using CVD, PECVD, PVD, ALD, or any combination(s) of the above. In selected embodiments, the dual gate oxide layer(s) 114 may be formed by a low temperature CVD or ALD process to a predetermined final thickness in the range of 1-100 Angstroms (e.g., 10-50 Angstroms, or more particularly, 42 Angstroms), though other thicknesses and/or materials may be used. A suitable high-k gate dielectric material for the DGO layer(s) 114 is an insulator material having a dielectric constant value k of 7.0 or greater that is lower than the dielectric constant value of the subsequently formed high-k gate dielectric layer 120 (described below). A suitable temperature for the deposition process is in the range of approximately 200 degrees Celsius to approximately 400 degrees Celsius, and is controlled to reduce or eliminate the diffusion of germanium from any underlying silicon germanium channel layer. A suitable high-k gate dielectric material for use as the DGO layer(s) 114 is a hafnium-based dielectric which does not adversely interact with the underlying silicon germanium substrate layer in the DGO region 150, such as hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_x$, $ZrSiO_x$, $LaSiO_x$, $YSiO_x$, $ScSiO_x$, $CeSiO_x$, and $HfLaSiO_x$. In addition, multi-metallic oxides (for example barium strontium titanate, BST) may also provide high-k dielectric properties. As will be appreciated, the DGO layer(s) 114 may be formed in other ways in other embodiments.

At this point in the fabrication sequence, the DGO device area 151 includes a gate dielectric stack formed to a first predetermined thickness with the one or more dual gate oxide layers 114, while the high voltage device area 150 and low voltage device area 152 both include gate dielectric layer stacks formed to a second, thicker predetermined thickness with the first thermally grown dielectric layer 108, second deposited dielectric layer 110, and one or more dual gate oxide layers 114. In the low voltage device area 152, the presence of the gate dielectric layer stack 108, 110, 114 helps to reduce the formation of STI divots, as would otherwise occur if the layers 108, 110, 114 were selectively patterned and etched from the low voltage device area 152.

Figure 5:
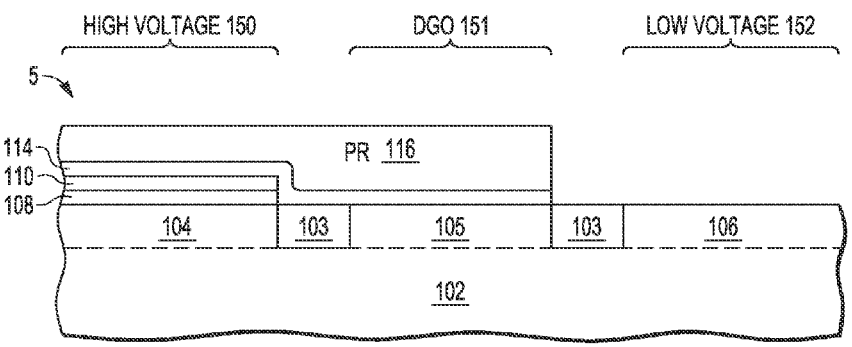

FIG. 5 illustrates processing of a semiconductor wafer structure 5 subsequent to FIG. 4 after removing the gate dielectric layer stack 108, 110, 114 from the low voltage device areas 152. While the dielectric layers 108, 110, 114 may be removed with any desired sequence, one or more selective etch processes may be used in selected embodiments by first forming a patterned etch mask 116 on the DGO layer(s) 114 in the high voltage and DGO device areas 150, 151. The patterned etch mask 116 may be formed by applying a layer of photoresist that is patterned directly on the DGO layer(s) 114 to mask the HV and DGO device areas 150, 151, or a multi-layer masking technique may be used to form a etch mask pattern 116 over the DGO layer(s) 114 in the HV and DGO device areas 150, 151. With the patterned etch mask 116 in place, exposed portions of the low voltage gate dielectric layer stack 108, 110, 114 are removed, thereby forming an opening 117 which exposes the low voltage device areas 152 of the substrate 102. The pattern transfer and etching of the mask layer 116 may use one or more etching steps to remove the unprotected portions of the layers 108, 110, 114, including a dry etching process such as reactive-ion etching, ion beam etching, plasma etching or laser etching, a wet etching process wherein a chemical etchant is employed or any combination thereof. For example, the exposed portions of low voltage gate dielectric stack 108, 110, 114 may be anisotropically etched using a reactive ion etch process, leaving the high voltage gate dielectric layers 108, 110, 114 in the HV device area 150 and DGO layer(s) 114 in the DGO device area 151. In other embodiments, the exposed portions of the gate dielectric layer stack 108, 110, 114 may be removed using a hydrofluoric acid (HF) clean, such as a diluted HF clean process.

Figure 6:
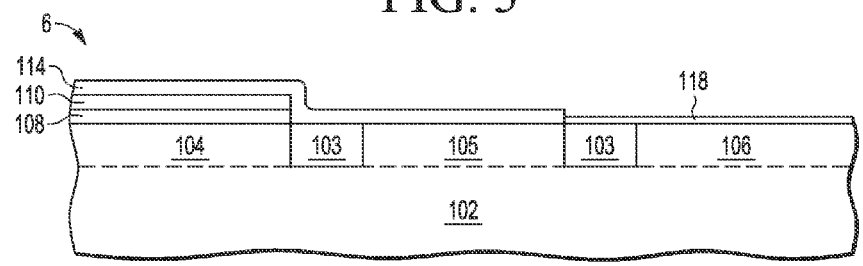

FIG. 6 illustrates processing of a semiconductor wafer structure 6 subsequent to FIG. 5 after the mask layer 116 is removed or stripped, and a first base oxide layer 118 is disposed on at least the low voltage device areas 152 as a first step in forming high-k gate dielectric layers on the semiconductor wafer structure 6. By way of providing a non-limiting example of processing steps that may be used, the first base oxide layer 118 may be formed over the low voltage device areas 152 by growing a base dielectric layer of silicon dioxide and/or other suitable gate dielectric layer(s) to a predetermined gate dielectric thickness using a thermal growth or oxidation process, depending on the gate dielectric requirements of the low voltage devices formed in the device area 152. For example, in the low voltage device area 152, the gate dielectric layer 118 may be selectively formed as a base dielectric layer by thermally growing an oxide layer to a predetermined thickness in the range of 1-50 Angstroms (e.g., 5-15 Angstroms, or more particularly, 5-10 Angstroms), though other thicknesses and/or materials may be used. Though the first base oxide layer 118 is shown as being formed only on the low voltage device areas 152 for purposes of simplicity, it will be appreciated that any thermal growth or oxidation process will also grow a thinner oxide layer on the surface of the substrate 102 due to the presence of the dielectric layers 108, 110, 114. Alternatively, the first base oxide layer 118 may be formed over the semiconductor wafer structure 6 by depositing an oxide with a low pressure chemical vapor deposition (LPCVD) high temperature oxide (HTO) to a predetermined thickness in the range of 1-50 Angstroms (e.g., 5-15 Angstroms, or more particularly, 5-10 Angstroms), though other thicknesses and/or materials may be used.

Figure 7:
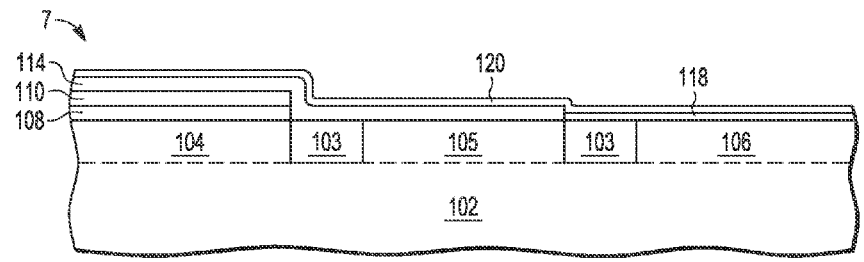

FIG. 7 illustrates processing of a semiconductor wafer structure 7 subsequent to FIG. 6 after a high-k dielectric layer 120 is disposed on the semiconductor wafer structure 7 to cover the first base oxide layer 118, the DGO layer(s) 114 and the gate dielectric layers 108, 110. By way of providing a non-limiting example of processing steps that may be used, the high-k dielectric layer 120 may be formed over the different regions 150-152 by depositing a high-k gate dielectric material with a relatively high dielectric constant value on top of the base dielectric layer 118 using CVD, PECVD, PVD, ALD, or any combination(s) of the above. In selected embodiments, the high-k dielectric layer 120 may be formed by a low temperature CVD or ALD process to a predetermined final thickness in the range of 1-50 Angstroms (e.g., 15-30 Angstroms, or more particularly, 17-20 Angstroms), though other thicknesses may be used. A suitable for the high-k dielectric layer 120 is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_x$, $ZrSiO_x$, $LaSiO_x$, $YSiO_x$, $ScSiO_x$, $CeSiO_x$, and $HfLaSiO_x$. In addition, multi-metallic oxides (for example barium strontium titanate, BST) may also provide high-k dielectric properties. A suitable temperature for the deposition process is in the range of approximately 200 degrees Celsius to approximately 400 degrees Celsius. As will be appreciated, the high-k dielectric layer 120 may be formed in other ways in other embodiments.

Figure 8:
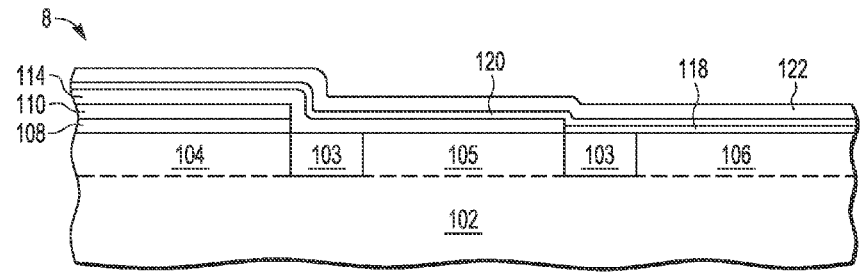

FIG. 8 illustrates processing of a semiconductor wafer structure 8 subsequent to FIG. 7 after a first metal-based layer 122 is disposed on the semiconductor wafer structure 8 as a barrier and/or interface layer to cover the high-k dielectric layer 120, first base oxide layer 118, the DGO layer(s) 114 and the gate dielectric layers 108, 110. By way of providing a non-limiting example of processing steps that may be used, the first metal-based layer 122 may be formed over the different regions 150-152 using any desired deposition or sputtering process, such as CVD, PECVD, PVD, ALD, molecular beam deposition (MBD) or any combination(s) thereof. A suitable material for use as the metal-based layer 122 is an element or alloy (e.g., TiN, TaC or W) which may be deposited over the NMOS and PMOS regions to a predetermined thickness of 20-150 Angstroms (e.g., 50-100 Angstroms), though other metallic layer materials with different thicknesses may be used. In selected embodiments, the metal-based layer 122 may include an element selected from the group consisting of Ti, Ta, La, Ir, Mo, Ru, W, Os, Nb, Ti, V, Ni, W, and Re to form a metal or metal-based layer that may contain carbon and/or nitrogen (such as TiN, TaC, HfC, TaSi, ZrC, Hf, etc.) or even a conductive metal oxide (such as $IrO_2$).

Figure 9:
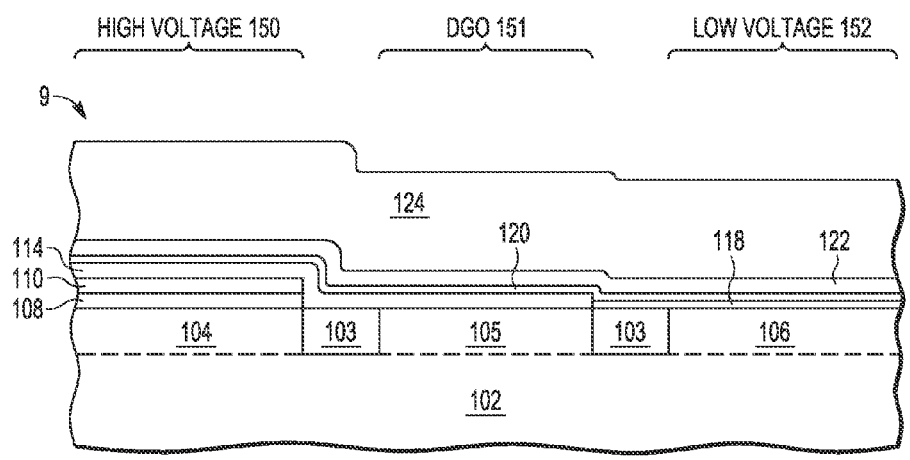

FIG. 9 illustrates processing of a semiconductor wafer structure 9 subsequent to FIG. 8 after a gate conductor layer 124 is disposed over the metal-based layer 122 to form a conductive gate stack. In selected embodiments, the gate conductor layer 124 may be an amorphous or polysilicon layer or an amorphous/poly silicon germanium layer that is formed using CVD, PECVD, PVD, ALD, MBD, or any combination(s) thereof to a predetermined thickness in the range of 200-1000 Angstroms (e.g., 500-600 Angstroms), though other materials and thicknesses may be used. The silicon-containing gate conductor layer 124 may also be a doped or undoped amorphous silicon or silicon germanium layer. An anti-reflective coating (ARC) (not shown) may subsequently be formed over gate conductor layer 124 to a thickness in the range of approximately 10 to 200 Angstroms, though other thicknesses may be used. In a selected embodiment, ARC layer is formed by depositing a silicon-rich silicon nitride layer, an organic ARC, a silicon-oxy nitride, or any ARC material which serves an ARC function for the particular lithography process. As will be appreciated, ARC layer may be applied directly to the gate conductor layer 124 or as part of a multilayer mask on the gate conductor layer 124. As deposited, the amorphous silicon-containing gate conductor layer 124 conformally covers the different regions 150-152 and/or may be formed as a planarized or polished gate conductor layer 124.

Figure 10:
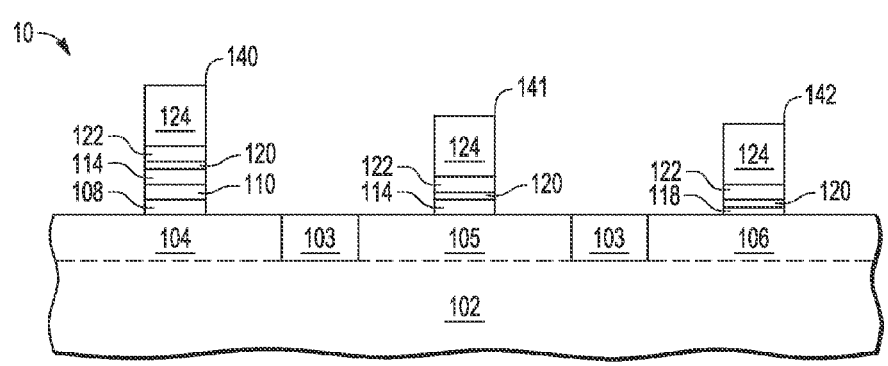

FIG. 10 illustrates processing of a semiconductor wafer structure 10 subsequent to FIG. 9 after patterned gate electrodes are formed in the high voltage, DGO, and low voltage device areas 150-152. In selected embodiments, the metal gate stack is selectively etched to form NMOS and PMOS gate electrodes in the device areas 150-152 using any desired pattern and etching processes, including application and patterning of photoresist directly on the ARC layer, though multi-layer masking techniques may also be used. As formed, the patterned gate electrodes 140 for high voltage NMOS and PMOS transistor devices in the high voltage device area 150 include a patterned conductive gate layer 124 and metal barrier/interface layer 122 formed on a high voltage gate dielectric layer which includes a thermally grown oxide layer 108, a deposited oxide layer 110, a dual gate oxide layer 114, and high-k gate dielectric layer 120. In addition, the patterned gate electrodes 141 for high voltage NMOS and PMOS transistor devices in the DGO device area 151 include a patterned conductive gate layer 124 and metal barrier/interface layer 122 formed on a medium voltage gate dielectric layer formed with a dual gate oxide layer 114 and high-k gate dielectric layer 120. Finally, the patterned gate electrodes 142 for low voltage NMOS and PMOS transistor devices in the low voltage device area 152 include a patterned conductive gate layer 124 and metal barrier/interface layer 122 formed on a low voltage gate dielectric layer formed with a base oxide layer 118 and high-k gate dielectric layer 120.

Figure 11:
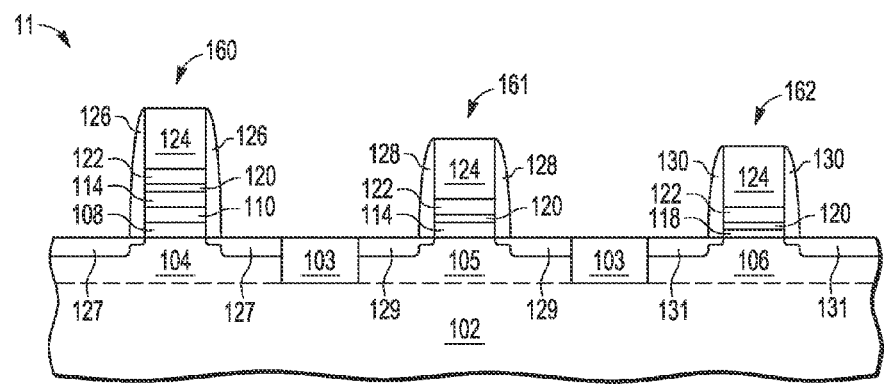

FIG. 11 illustrates processing of a semiconductor wafer structure 11 subsequent to FIG. 10 after transistor devices 160-162 are formed in the different device regions 150-152 using the patterned high-k metal gate electrodes. While any desired fabrication sequence may be used, in an example processing sequence, the transistor devices 160-162 may be fabricated by first implanting source/drain regions 127, 129, 131 in the substrate 102, alone or in combination with halo or extension regions. Either before or after implanting the halo/extension/source/drain regions 127, 129, 131, one or more sidewall spacers 126, 128, 130 may be formed on the patterned gate electrode stacks for use as implant masks by depositing and anisotropically etching one or more dielectric layers (e.g., silicon dioxide or nitride). Using the sidewall spacers 126, 128, 130 and patterned gate electrode stacks 140-142 in combination with one or more patterned implant masks (not shown), deep source/drain implant regions 127, 129, 131 may be selectively formed in each of the regions 150-152 by implanting appropriate polarity dopants, depending on the polarity and design of the transistors. By way of example, n-type (or p-type) high voltage transistors 160 may be formed in the high voltage region 150 by implanting n-type (or p-type) source/drain regions 127 around the patterned gate electrode 140, alone or in combination with the sidewall spacers 126. Using the same implantation steps, n-type (or p-type) medium voltage transistors 161 may be formed in the DGO region 151 by implanting n-type (or p-type) source/drain regions 129 around the patterned gate electrode 141, alone or in combination with the sidewall spacers 128. In similar fashion, n-type (or p-type) low voltage core transistors 162 may be formed in the low voltage region 152 by implanting n-type (or p-type) source/drain regions 131 around the patterned gate electrode 142, alone or in combination with the sidewall spacers 130.

As described herein, the inclusion of the DGO layers 114 in the DGO device area 151 improves the interface quality with the upper gate oxide regions 120 because of the material similarity between the DGO layer 114 (e.g., $HiSiO_x$) and the high-k gate dielectric layer 120 (e.g., $HfO_2$). In addition, by forming the lower DGO layers 114 from a first high-k gate dielectric layer having a relatively lower k (e.g., $HfSiO_x$), the physical thickness increase required to meet desired electrical oxide thickness (Tox) is minimized, thus ensuring better film quality. Finally, the formation of the lower DGO layers 114 with a relatively low temperature deposition reduces the germanium diffusion from the silicon germanium channel layer in the DGO device area 151 which leads to high interface state density and reduced Time-Dependent Dielectric Breakdown (TDDB) problems, as compared to forming a gate dielectric layer with a high temperature thermal oxide process. In addition, the formation of the gate oxide regions 120 with the second relatively higher high-k layer provides improved core device performance for the low voltage NMOS and PMOS transistor devices.

As will be appreciated, additional or different processing steps may be used to complete the fabrication of the depicted device structures 160-162 into functioning devices. In addition to various front end processing steps (such as sacrificial oxide formation, stripping, isolation region formation, gate electrode formation, extension implant, halo implant, spacer formation, source/drain implant, annealing silicide formation, and polishing steps), additional backend processing steps may be performed, such as forming contact plugs and multiple levels of interconnect(s) that are used to connect the device components in a desired manner to achieve the desired functionality. Once the wafer fabrication process is completed, the wafer can be singulated or diced into separate integrated circuits dies for subsequent electrical connection, such as by leadframe attachment, wirebonding and encapsulation. Thus, the specific sequence of steps used to complete the fabrication of the device components may vary, depending on the process and/or design requirements.

Figure 12:
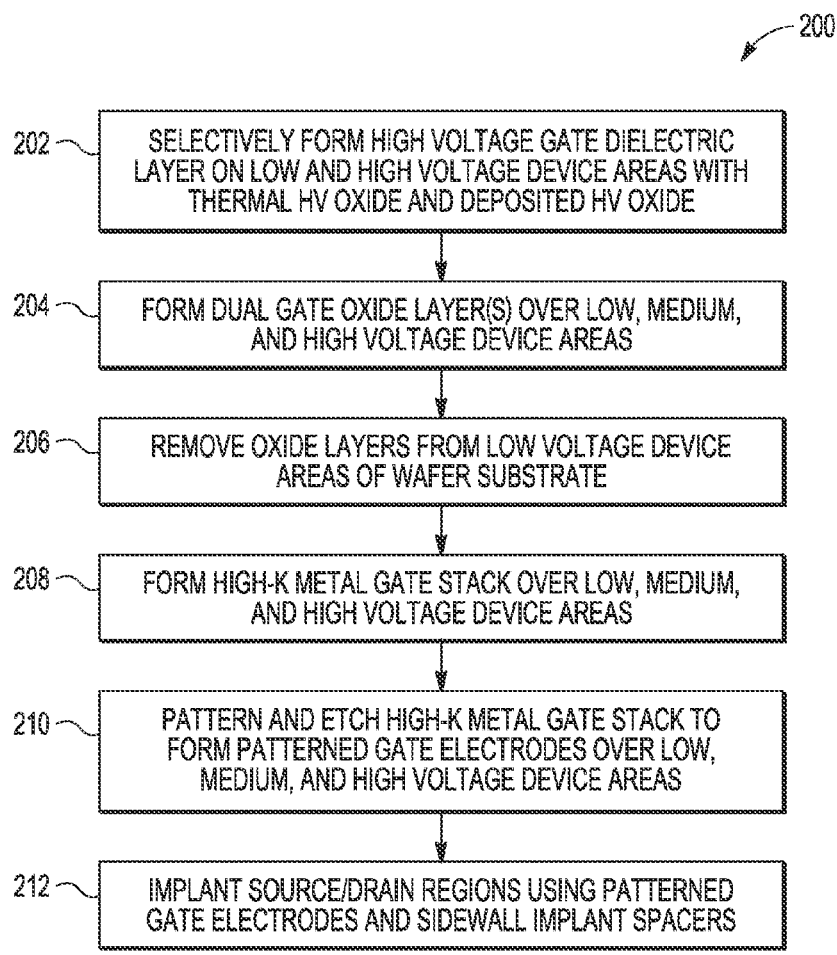
FIG. 12 illustrates an example process flow diagram of a fabrication sequence for integrating medium and high voltage transistor devices with a process flow for fabricating low voltage high-k metal gate transistor devices.

Turning now to FIG. 12, there is shown an example process flow diagram of a fabrication sequence 200 for integrating medium and high voltage transistor devices with a process flow for fabricating low voltage high-k metal gate transistor devices. As shown, the process begins at step 202 during the front end of line (FEOL) process by selectively forming a high voltage gate dielectric layer or stack on the low and high voltage device areas of a wafer substrate. For example, a first high voltage oxide layer may be thermally grown to a predetermined thickness (e.g., approximately 50 Angstroms) by oxidizing the exposed semiconductor surfaces of the wafer substrate, including the low, medium, and high voltage device areas. In addition, a second high voltage oxide layer may be deposited on the first high voltage oxide layer to a predetermined thickness (e.g., approximately 50 Angstroms), such as be using a low temperature CVD or ALD process to form the second high voltage oxide layer to cover the low, medium, and high voltage device areas. After patterning the first and second high voltage oxide layers using a patterned photoresist etch mask, a dry etch process is applied to remove the unmasked first and second high voltage oxide layers and form an opening on the wafer substrate over the medium voltage device area, leaving the high voltage gate dielectric layer or stack on the low and high voltage device areas of a wafer substrate.

At step 204, one or more dual gate oxide layers are formed over the low, medium, and high voltage device areas of the wafer substrate. In selected embodiments, the dual gate oxide layers are formed by depositing a high-k dielectric layer or other appropriate insulating layer over the low, medium, and high voltage device areas of the wafer substrate to a predetermined thickness (e.g., approximately 40 Angstroms), such as be using a low temperature CVD or ALD oxide deposition process.

At step 206, the oxide layers formed on the wafer substrate in the low voltage device area are selectively removed using one or more etch steps. For example, a patterned photoresist etch mask may be formed to cover and protect the medium and high voltage device areas. With the etch mask in place, a dry etch process may be applied to remove the unmasked oxide layers and form an opening on the wafer substrate over the low voltage device area, leaving the oxide layers in place over the medium and high voltage device areas of the wafer substrate. As a result, the gate dielectric layers formed in the high voltage device area are formed with a combination of the high voltage gate dielectric and the dual gate oxide layer, while the gate dielectric layers formed in the medium voltage device area are formed with the dual gate oxide layer.

At step 208, a high-k metal gate (HKMG) stack is formed over the wafer substrate, including the different gate dielectric layers formed in the low, medium, and high voltage device areas. While different materials and processes may be used to form the constituent layers of the HKMG stack, the HKMG stack may be formed by growing a base oxide layer on the wafer substrate to a predetermined thickness (e.g., less than approximately 10 Angstroms), depositing a high-k gate dielectric layer on the wafer substrate to a predetermined thickness (e.g., approximately 15-20 Angstroms), depositing a metal barrier or interface layer on the high-k gate dielectric layer, and then depositing a polysilicon layer or other gate conductor layer on the metal barrier/interface layer.

At step 210, the high-k metal gate stack is patterned and etched to form patterned gate electrodes over the wafer substrate, including the low, medium, and high voltage device areas. For example, a patterned photoresist gate etch mask may be formed to define a pattern of openings over the high-k metal gate stack which are anisatropically etched (e.g., with dry etch process) to remove the unmasked HKMG stack layers and form the patterned gate electrodes over the low, medium, and high voltage device areas.

At step 212, source/drain implant regions are selectively formed in the wafer substrate to define NMOS and PMOS transistor devices in the low, medium, and high voltage device areas. For example, source and drain regions may be defined in the low, medium, and high voltage device areas of the wafer substrate by implanting appropriate source/drain impurities around the patterned gate electrodes, alone or in combination with one or more sidewall spacers and/or implant masks. In an example sequence, one or more sidewall spacers are formed on the patterned gate electrodes and are used to implant source/drain regions in the exposed substrate areas. Subsequently, additional back end of line (BEOL) processing may be performed to deposit one or more additional interlayer dielectric layers and metal interconnect structures to make electrical contact with contacts formed at the NMOS and PMOS transistor devices.

By now, it should be appreciated that there has been provided herein a semiconductor fabrication process for integrating low, medium, and high voltage transistors on a single substrate. In the disclosed methodology, a wafer is provided that includes a first device area for forming one or more first voltage level transistors, a second device area for forming one or more second voltage level dual gate oxide transistors, and a third device area for forming one or more third voltage level transistors, where the first voltage level is higher than the second voltage level which is higher than the third voltage level. In selected embodiments, the wafer includes a semiconductor layer as a semiconductor-on-insulator (SOI) substrate structure or bulk substrate structure having one or more shallow trench isolation regions for separating the first, second, and third device areas from one another. On at least the second device area and a portion of the third device area where PMOS transistors are formed, a compressive silicon germanium layer may be formed, such as by epitaxially growing silicon germanium to a predetermined thickness. On the wafer, a high voltage gate dielectric stack is formed on the first and third device areas and not on the second device area. In selected embodiments, the high voltage gate dielectric stack may be selectively formed on the first and third areas by thermally growing a first oxide layer on the wafer on the first, second, and third device areas, depositing a second oxide layer on the first oxide layer, and then selectively removing the first and second oxide layers from the second device area to expose the second device area of the wafer. Subsequently, a dual gate oxide layer is formed over the first, second, and third device areas of the substrate by depositing one or more oxide layers (e.g., a high-k dielectric layer comprising a silicate or metal oxy-nitride material, such as $Hf_xSi_{1-x}O_y$, or $Hf_xSi_{1-x}O_yN_z$) on the high voltage gate dielectric stack and on the exposed second device area of the wafer. Subsequently, the high voltage gate dielectric stack and dual gate oxide layer are removed from the third device area to expose the third device area while leaving the dual gate oxide layer formed on the first and second device areas. To remove such layers, a patterned etch mask may be formed to cover the high voltage gate dielectric stack and dual gate oxide layer formed over the first device area and to protect the dual gate oxide layer formed over the second device area. With the patterned etch mask in place, the exposed high voltage gate dielectric stack and dual gate oxide layer formed over the third device area are selectively etched to expose the third device area. Over the first, second, and third device areas of the wafer, a high-k gate dielectric stack is formed to cover the dual gate oxide layer formed on the first and second device areas and to cover the exposed third device area. In selected embodiments, the high-k gate dielectric stack may be formed by thermally growing a base oxide layer on the wafer on at least the exposed third device area of the wafer, and then depositing a high-k layer of hafnium-based dielectric material (e.g., $HfO_2$) to cover the dual gate oxide layer formed over the first and second device areas and to cover the base oxide layer formed over the third device area. On the high-k layer of hafnium-based dielectric material, a metal-based barrier layer may be deposited to cover the first, second, and third device areas. Subsequently, patterned high-k metal gate electrodes are formed on the high-k gate dielectric stack in each of the first, second, and third device areas, such as by depositing a polysilicon layer on the high-k gate dielectric stack in each of the first, second, and third device areas, and then patterning and etching the polysilicon layer and underlying high-k gate dielectric stack to form the plurality of patterned high-k metal gate electrodes.

In another form, there is provided a method of forming a plurality of gate electrode structures on a shared substrate. In the disclosed methodology, a first gate dielectric device is formed in a first region of a semiconductor substrate for one or more first voltage level transistors. As formed, the first gate dielectric device includes a grown gate dielectric layer formed on the shared substrate, a deposited gate dielectric layer formed on the grown gate dielectric layer, a first high-k gate dielectric layer deposited on the deposited gate dielectric layer, and a second high-k gate dielectric layer deposited on the first high-k gate dielectric layer. In selected embodiments, the dielectric constant value of the first high-k dielectric layer is smaller than the dielectric constant value for the second high-k dielectric layer. In selected embodiments, the first gate dielectric device is formed by thermally growing a first oxide layer as the grown gate dielectric layer on at least the first region of the semiconductor substrate; depositing a second oxide layer as the deposited gate dielectric layer on the first oxide layer over at least the first region of the semiconductor substrate; depositing a dual gate oxide layer as the first high-k gate dielectric layer on the second oxide layer over at least the first region of the semiconductor substrate; and depositing a hafnium oxide layer as the second high-k gate dielectric layer on the dual gate oxide layer over at least the first region of the semiconductor substrate. In addition, a second gate dielectric device is formed in a second region of a semiconductor substrate for one or more second voltage level voltage NMOS and PMOS transistors. As formed, the second gate dielectric device includes the first high-k gate dielectric layer deposited on the shared substrate, and the second high-k gate dielectric layer deposited on the first high-k gate dielectric layer. In selected embodiments, the second gate dielectric device is formed by depositing a dual gate oxide layer (e.g., a layer of $Hf_xSi_{1-x}O_y$ or $Hf_xSi_{1-x}O_yN_z$) as the first high-k gate dielectric layer on at least the second region of the semiconductor substrate, and depositing a hafnium oxide layer as the second high-k gate dielectric layer on the dual gate oxide layer over at least the second region of the semiconductor substrate. In addition, a third gate dielectric device is formed in a third region of a semiconductor substrate for one or more third voltage level transistors. As formed, the third gate dielectric device includes a base gate dielectric layer grown on the third region of the shared substrate and a second high-k gate dielectric layer deposited on the base gate dielectric layer. In selected embodiments, the third gate dielectric device is formed by thermally growing abuse oxide layer as the base gate dielectric layer on at least the third region of the semiconductor substrate, and depositing a hafnium oxide layer as the second high-k gate dielectric layer on the base oxide layer over at least the third region of the semiconductor substrate. Prior to forming the second and third gate dielectric devices, a compressive silicon germanium layer may be epitaxially grown on the second region of the semiconductor substrate and in a portion of the third region of the semiconductor substrate where PMOS transistors are formed. In selected embodiments, the first voltage level is higher than the second voltage level which is higher than the third voltage level. On the first, second, and third gate dielectric devices, one or more gate conductor layers are formed and then selectively etched to form a plurality of gate electrode structures on the first, second, and third regions of the shared substrate. In addition, a silicide layer may be formed on each of the plurality of patterned gate electrodes to form a plurality of patterned high-k metal gate electrodes. In selected embodiments, the gate conductor layers may be formed by depositing one or more metal-based barrier layers on the first, second, and third gate dielectric devices; and depositing a polysilicon layer on the one or more metal-based barrier layers to cover the first, second, and third regions. In addition, the gate conductor layers and the first, second, and third gate dielectric devices may be selectively etched by forming a patterned etch mask on the polysilicon layer with one or more openings formed over the polysilicon layer and underlying one or more metal-based barrier layers and the underlying first, second, and third gate dielectric devices; and then selectively etching through the one or more openings in the patterned etch mask to remove exposed portions of the polysilicon layer and underlying one or more metal-based barrier layers and the underlying first, second, and third gate dielectric devices to form the plurality of gate electrode structures on the first, second, and third regions of the shared substrate. As formed, the first gate dielectric device has a combined thickness that is thicker than the second gate dielectric device, and the second gate dielectric device has a combined thickness that is thicker than the first gate dielectric device. In this way, formation of the first, second, and third gate dielectric devices uses only a single etch step to remove the grown gate dielectric layer, deposited gate dielectric layer, and first high-k gate dielectric layer from the third region of the semiconductor substrate before forming the base gate dielectric layer and second high-k gate dielectric layer.

In yet another form, there is provided a semiconductor device and associated method of fabricating a plurality of transistors having different gate dielectric structures integrated on a shared substrate. In the disclosed semiconductor device, a semiconductor substrate has a first device area for forming one or more first voltage level transistors, a second device area for forming one or more second voltage level dual gate oxide transistors, and a third device area for forming one or more third voltage level transistors. In the first device area, one or more first voltage level high-k metal gate transistors are formed, each comprising one or more patterned metal gate layers formed over a patterned first gate dielectric device having a grown oxide layer formed on the first region of the semiconductor substrate, a deposited gate oxide layer formed on the grown oxide layer, a first dual gate oxide layer deposited on the deposited gate oxide layer, and a first high-k gate dielectric layer deposited on the first dual gate oxide layer. In the second device area, one or more second voltage level high-k metal gate transistors are formed, each comprising one or more patterned metal gate layers formed over a patterned second gate dielectric device having a second dual gate oxide layer deposited on the second region of the semiconductor substrate and a second high-k gate dielectric layer deposited on the second dual gate oxide layer. In the third device area, one or more third voltage level high-k metal gate transistors are formed, each comprising one or more patterned metal gate layers formed over a patterned third gate dielectric device having a base oxide layer grown on the third region of the semiconductor substrate and a third high-k gate dielectric layer deposited on the base oxide layer; where the first voltage level is higher than the second voltage level which is higher than the third voltage level.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. For example, although the process flow is described above with reference to a gate-first process, selected embodiments of the present invention may be implemented with a gate-last process in which the patterned gate electrodes are encapsulated with a planarized dielectric layer and replaced with one or more different metal gate layers that are polished down to the planarized dielectric layer. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the invention is not limited to any particular type of integrated circuit described herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process comprising:
    providing a wafer comprising a first device area for forming one or more first voltage level transistors, a second device area for forming one or more second voltage level dual gate oxide transistors, and a third device area for forming one or more third voltage level transistors;
    forming a high voltage gate dielectric stack on the first and third device areas of the wafer and not on the second device area of the wafer;
    forming a dual gate oxide layer over the first, second, and third device areas of the wafer by depositing one or more oxide layers on the high voltage gate dielectric stack and on the exposed second device area of the wafer;
    removing the high voltage gate dielectric stack and dual gate oxide layer from the third device area of the wafer while leaving the dual gate oxide layer formed on the first and second device areas;
    forming a high-k gate dielectric stack over the first, second, and third device areas of the wafer to cover the dual gate oxide layer formed on the first and second device areas and the third device area of the wafer; and
    forming a plurality of patterned high-k metal gate electrodes on the high-k gate dielectric stack in each of the first, second, and third device areas; where the first voltage level is higher than the second voltage level which is higher than the third voltage level.

2. The semiconductor fabrication process of claim 1, where providing the wafer comprises providing a first semiconductor layer as a semiconductor-on-insulator (SOI) substrate structure or bulk substrate structure comprising one or more shallow trench isolation regions for separating the first, second, and third device areas from one another.

3. The semiconductor fabrication process of claim 1, where providing the wafer comprises providing a compressive silicon germanium layer formed in the second device area and in a portion of the third device area where PMOS transistors are formed.

4. The semiconductor fabrication process of claim 1, where forming the high voltage gate dielectric stack comprises:
    thermally growing a first oxide layer on the wafer on the first, second, and third device areas;
    depositing a second oxide layer on the first oxide layer over the first, second, and third device areas; and
    selectively removing the first and second oxide layers from the second device area, thereby exposing the second device area of the wafer.

5. The semiconductor fabrication process of claim 1, where forming the dual gate oxide layer comprises depositing a high-k dielectric layer comprising a silicate or metal oxynitride material.

6. The semiconductor fabrication process of claim 1, where removing the high voltage gate dielectric stack and dual gate oxide layer from the third device area comprises:
    forming a patterned etch mask to cover the high voltage gate dielectric stack and dual gate oxide layer formed over the first device area and to protect the dual gate oxide layer formed over the second device area; and
    selectively etching the high voltage gate dielectric stack and dual gate oxide layer formed over the third device area to expose the third device area.

7. The semiconductor fabrication process of claim 1, where forming the high-k gate dielectric stack comprises:
    thermally growing a base oxide layer on the wafer on at least the exposed third device area of the wafer;
    depositing a high-k layer of hafnium-based dielectric material to cover the dual gate oxide layer formed over the first and second device areas and to cover the base oxide layer formed over the third device area; and
    depositing a metal-based barrier layer on the high-k layer of hafnium-based dielectric material to cover the first, second, and third device areas.

8. The semiconductor fabrication process of claim 1, where forming the plurality of patterned high-k metal gate electrodes comprises:
- depositing a polysilicon layer on the high-k gate dielectric stack in each of the first, second, and third device areas; and
- patterning and etching the polysilicon layer and underlying high-k gate dielectric stack to form the plurality of patterned high-k metal gate electrodes.

\* \* \* \* \*